US012004301B2

(12) United States Patent
Park et al.

(10) Patent No.: US 12,004,301 B2
(45) Date of Patent: Jun. 4, 2024

(54) CIRCUIT BOARD

(71) Applicant: DONGWOO FINE-CHEM CO., LTD., Iksan-si (KR)

(72) Inventors: Ki Joon Park, Hwaseong-si (KR); Sung Jin Noh, Hanam-si (KR); Jungu Lee, Suwon-si (KR)

(73) Assignee: DONGWOO FINE-CHEM CO., LTD., Iksan-si (KR)

( * ) Notice: Subject to any disclaimer, the term of this patent is extended or adjusted under 35 U.S.C. 154(b) by 273 days.

(21) Appl. No.: 17/554,144

(22) Filed: Dec. 17, 2021

(65) Prior Publication Data
US 2022/0210923 A1 Jun. 30, 2022

(30) Foreign Application Priority Data

Dec. 24, 2020 (KR) .......... 10-2020-0183397
Oct. 18, 2021 (KR) .......... 10-2021-0138563

(51) Int. Cl.
*H05K 3/00* (2006.01)
*H05K 3/28* (2006.01)
(52) U.S. Cl.
CPC .......... *H05K 3/0011* (2013.01); *H05K 3/284* (2013.01); *H05K 2203/1333* (2013.01)
(58) Field of Classification Search
CPC ......... H05K 1/0306; H05K 2201/0338; H05K 2203/1333; H05K 3/0011; H05K 3/14; H05K 3/282; H05K 3/284; H05K 3/388; H05K 3/4605; H05K 3/465; H05K 3/00; H05K 3/28
USPC ......................................... 174/260
See application file for complete search history.

(56) References Cited

U.S. PATENT DOCUMENTS

| | | | |
|---|---|---|---|
| 2015/0380670 A1* | 12/2015 | Aoki ............... | H10K 30/81 257/40 |
| 2019/0269013 A1* | 8/2019 | Takagi ............. | H01G 4/228 |
| 2020/0273763 A1* | 8/2020 | Tsuchida .......... | H05K 3/46 |

FOREIGN PATENT DOCUMENTS

| | | | | |
|---|---|---|---|---|
| EP | 3276693 A1 | * | 1/2018 | ......... H01L 51/4213 |
| KR | 19980074509 A | * | 11/1998 | ........... H01L 23/495 |
| KR | 10-2014-0000608 A | | 1/2014 | |

* cited by examiner

*Primary Examiner* — Timothy J Thompson
*Assistant Examiner* — Guillermo J Egoavil
(74) *Attorney, Agent, or Firm* — Sughrue Mion, PLLC

(57) ABSTRACT

A circuit board includes a base layer, an electrode layer formed on the base layer, a passivation layer formed on the electrode layer while opening a part of the electrode layer, and a surface treatment layer formed on the open surface of the electrode layer. The surface treatment layer may contain 70 to 40% of copper and 30 to 60% of nickel.

8 Claims, 1 Drawing Sheet

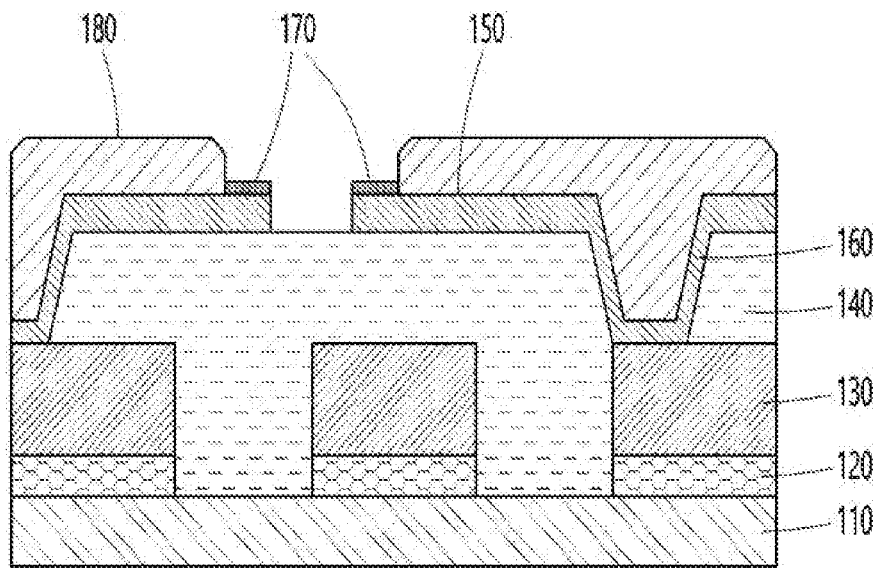

CIRCUIT BOARD

CROSS REFERENCE TO RELATED APPLICATIONS

The instant application claims priority based on Korean Patent Application No. 10-2020-0183397 filed Dec. 24, 2020 and Korean Patent Application No. 10-2021-0138563 filed Oct. 18, 2021, the entire contents of which are hereby incorporated by reference.

TECHNICAL FIELD

The present invention relates to a circuit board. Particularly, the present invention relates to a circuit board capable of preventing or minimizing a decrease in adhesion, an increase in sheet resistance, and a decrease in environmental reliability of a surface treatment layer for preventing corrosion of a metal electrode layer.

BACKGROUND ART

A circuit board may include a base layer, an electrode layer formed on the base layer, and the like. The electrode layer is usually made of metal, and the metal may be corroded by moisture or the like when exposed. In order to prevent such corrosion of the electrode layer, a surface treatment layer is formed on the electrode layer.

Korean Patent Application Publication No. 10-2014-0000608 (Package on package devices and methods of packaging semiconductor dies) discloses forming a protective layer on sidewalls of a metal pillar. The protective layer is made of tin (Sn), gold (Au), copper-germanium alloy (CuGe), copper (Cu), nickel (Ni), lead (Pd), organic compound (Organic Solderability Preservative: OSP), etc. The protective layer made of this material has difficulty in meeting desired standards in adhesion, sheet resistance, and environmental reliability (corrosion).

DISCLOSURE OF INVENTION

Technical Problem

The present invention is to solve the problems of the prior art, and an object of the present invention is to increase the adhesion, sheet resistance, and environmental reliability (corrosion) of a surface treatment layer in a circuit board to desired standards.

Technical Solution

A circuit board of the present invention for achieving this purpose may be configured to include a base layer, an electrode layer, a passivation layer, a surface treatment layer, and so on.

The electrode layer may be formed on the base layer.

The passivation layer may be formed on the electrode layer while opening a part of the electrode layer.

The surface treatment layer may be formed on the open surface of the electrode layer.

In the circuit board of the present invention, the base layer may be made of glass.

The circuit board of the present invention may further comprise a seed layer formed between the base layer and the electrode layer.

In the circuit board of the present invention, the surface treatment layer may be made of an alloy of copper and nickel.

In the circuit board of the present invention, the surface treatment layer may contain 70 to 40% of copper and 30 to 60% of nickel.

In the circuit board of the present invention, the electrode layer may include a first electrode layer and a second electrode layer. In this case, an insulation layer may be formed between the first electrode layer and the second electrode layer.

The circuit board of the present invention may include a via penetrating the insulation layer to connect the first electrode layer and the second electrode layer.

In the circuit board of the present invention, the passivation layer may be formed on the second electrode layer, the insulation layer, and the via while opening a part of the second electrode layer.

In the circuit board of the present invention, the surface treatment layer may be formed on the open surface of the second electrode layer.

In the circuit board of the present invention, the open surface of the second electrode layer on which the surface treatment layer is formed may act as an LED landing pad on which an LED is mounted.

In the circuit board of the present invention, the second electrode layer may include a common wire commonly connected to the LED landing pad and an individual wire individually connected to the LED landing pad.

In the circuit board of the present invention, the first electrode layer or the second electrode layer may include a dummy wire not connected to the LED landing pad.

Advantageous Effects

In the circuit board of the present invention, the surface treatment layer is composed of an alloy of copper and nickel with 70 to 40% of copper and 30 to 60% of nickel. Through this configuration, the surface treatment layer of the present invention can satisfy the standards of adhesion, sheet resistance, and environmental reliability (corrosion).

DESCRIPTION OF DRAWINGS

FIG. 1 is a cross-sectional view showing a structure of a circuit board according to the present invention.

BEST MODE

Hereinafter, the present invention is described in more detail with reference to the accompanying drawings.

FIG. 1 is a cross-sectional view showing a structure of a circuit board according to the present invention.

As shown in FIG. 1, the circuit board of the present invention may include a base layer 110, a seed layer 120, a first electrode layer 130, an insulation layer 140, a second electrode layer 150, a via 160, a surface treatment layer 170, a passivation layer 180, and so on.

The base layer 110 is a substrate of the circuit board and may be made of a glass material. The base layer 110 may have a size of 1,100×1,250 mm. The base layer 110 may have a thickness in the range of 0.4 to 0.7 mm.

Other than glass, the base layer 110 may be configured in a film form, for example, a PI film, a COP film, a PET film, or the like.

The seed layer 120 may be formed on the base layer 110. The seed layer 120 may perform a function of firmly coupling the first electrode layer 130 coupled thereto to the base layer 110. The seed layer 120 may have the same pattern as the first electrode layer 130.

The seed layer 120 may be made of a conductive metal such as chromium, nickel, or a chromium/nickel alloy, or a metal oxide such as indium zinc oxide (IZO), indium tin oxide (ITO), aluminum zinc oxide (AZO), zinc oxide (ZnOx), titanium oxide ($TiO_2$), or aluminum oxide ($Al_2O_3$).

The seed layer 120 may be formed by a method of forming a circuit pattern, and for example, a photo process, a sputtering process, or the like may be used.

In the photo process, a metal oxide is formed on the base layer 110, a resist layer is formed thereon, and processes such as exposure, development, etching, and peeling of the resist layer may be performed.

In the sputtering process, sputtering may be performed with a metal oxide target in an inert atmosphere, or with a metal target in an atmosphere containing oxygen.

The first electrode layer 130 may be formed on the seed layer 120. The first electrode layer 130 may be formed by patterning a conductive metal. As the conductive metal, for example, silver (Ag), copper (Cu), gold (Au), aluminum (Al), platinum (Pt), palladium (Pd), chromium (Cr), tungsten (W), titanium (Ti), tantalum (Ta), iron (Fe), cobalt (Co), nickel (Ni), zinc (Zn), tellurium (Te), vanadium (V), niobium (Nb), molybdenum (Mo), etc. may be used.

The first electrode layer 130 may be configured in a mesh pattern to eliminate visibility.

The first electrode layer 130 is a conductive circuit layer and may be used for power supply, signal transmission, and the like.

The first electrode layer 130 may be connected vertically to the second electrode layer 150 to be described later and function as a common wire commonly connected to a plurality of components or as an individual wire individually connected to one component. A part of the first electrode layer 130 may be a dummy wire that is not connected to a power source or the like.

The first electrode layer 130 may be formed by utilizing a method of forming a circuit pattern, for example, a photo process, sputtering, plating process, or the like.

In the photo process, a metal is formed on the base layer 110, a resist layer is formed thereafter, and processes such as exposure, development, etching, and peeling of the resist layer may be performed.

The sputtering process may be performed with a conductive metal target in an inert atmosphere such as argon.

The plating process may be performed in an electrolytic or electroless manner using the seed layer 120.

The insulation layer 140 may be formed on the first electrode layer 130.

The insulation layer 140 insulates the first electrode layer 130 and the second electrode layer 150, and may be made of an insulating material, for example, a thermosetting or photocurable organic material such as an epoxy compound, an acrylic compound, or a melanin compound.

The second electrode layer 150 may be formed on the insulation layer 140.

The second electrode layer 150 may be formed by patterning a conductive metal. As the conductive metal, the same material as that of the first electrode layer 130, for example, silver (Ag), copper (Cu), gold (Au), aluminum (Al), platinum (Pt), palladium (Pd), chromium (Cr), tungsten (W), titanium (Ti), tantalum (Ta), iron (Fe), cobalt (Co), nickel (Ni), zinc (Zn), tellurium (Te), vanadium (V), niobium (Nb), molybdenum (Mo), etc. may be used.

Like the first electrode layer 130, the second electrode layer 150 may be configured in a mesh pattern in order to eliminate visibility.

Similar to the first electrode layer 130 described above, the second electrode layer 150 is a conductive circuit layer and may be used for power supply, signal transmission, and the like.

The second electrode layer 150 may be connected vertically to the first electrode layer 130 and function as a common wire commonly connected to a plurality of components or as an individual wire individually connected to one component. A part of the second electrode layer 150 may be a dummy wire that is not connected to a power source or the like.

As shown in FIG. 1, a part of the second electrode layer 150 is not closed by the passivation layer 180 to be described later, but is opened to the outside (even though the upper surface of the open part will be covered with the surface treatment layer 170 to be described later, it is described that an opening is formed with reference to the second electrode layer 150 here), and various mounting components such as a light emitting diode (not shown) may be coupled to the opening region. As such, the opening region of the second electrode layer 150 may function as a landing pad. Here, a plurality of the landing pad may be provided.

A common wire or an individual wire may be connected to the landing pad of the second electrode layer 150. The common wire may be commonly connected to a plurality of landing pads, and the individual wires may respectively be connected to a plurality of landing pads. For example, the common wire may be provided as a cathode wire of the circuit board, and the individual wire may be provided as an anode wire of the circuit board. Through this configuration, it is possible to individually control the light emitting diodes (LEDs) coupled to the landing pads.

The second electrode layer 150 may be formed by utilizing a method of forming a circuit pattern, for example, the photo process, sputtering, plating process, etc. described above.

The plating process may be performed in an electrolytic or electroless manner.

The via 160 may pass through the insulation layer 140 to connect the first electrode layer 130 and the second electrode layer 150, or connect the first electrode layer 130 to an external connection terminal.

The via 160 may be made of, like the first and second electrode layers 130 and 150, a conductive metal, for example, silver (Ag), copper (Cu), gold (Au), aluminum (Al), platinum (Pt), palladium (Pd), chromium (Cr), tungsten (W), titanium (Ti), tantalum (Ta), iron (Fe), cobalt (Co), nickel (Ni), zinc (Zn), tellurium (Te), vanadium (V), niobium (Nb), molybdenum (Mo), or the like.

The via 160 may be formed in the same process as the second electrode layer 150, and in this case, the second electrode layer 150 and the via 160 may be integrally formed.

The surface treatment layer 170 is formed to prevent corrosion of the open surface of the second electrode layer 150, and may be formed on the open surface of the second electrode layer 150.

The surface treatment layer 170 may preferably be formed only on the open surface of the second electrode layer 150. However, if it is easier to form over the entire surface of the second electrode layer 150 in the process, the surface treatment layer 170 may be formed on the entire surface of the second electrode layer 150. In this case, a part of the surface treatment layer 170 may be buried in the passivation layer 180.

The surface treatment layer 170 may be made of tin (Sn), gold (Au), copper-germanium alloy (CuGe), copper (Cu), nickel (Ni), lead (Pd), or an organic compound (Organic Solderability Preservative: OSP) alone. In this case, however, it is difficult to meet the criteria in adhesion, sheet resistance, environmental reliability (corrosion), etc. Accordingly, a number of experiments were performed on the alloys thereof. As a result, it was confirmed that the adhesion, sheet resistance, and environmental reliability (corrosion) were significantly improved when copper (Cu) and nickel (Ni) were mixed to form an alloy to be used.

However, even if a copper/nickel alloy is used as the surface treatment layer 170, not all alloys with various mixing ratios satisfied all acceptable criteria in adhesion, sheet resistance, environmental reliability (corrosion), etc.

Table 1 below shows the change in adhesion of the surface treatment layer 170 according to the mixing ratio of copper and nickel when the surface treatment layer 170 is formed of a copper/nickel alloy. Here, in the adhesion test, the force that a chip moves, that is, the minimum force, is measured when the chip is pushed to the side of the chip with a measuring tip in a state where the chip is placed on the surface treatment layer 170. If the measured value of the adhesion (gf/inch) was less than 200, it was indicated as ×, if it was greater than 200 and less than 1500, it was indicated as Δ, and if it was greater than or equal to 1500, it was indicated as ○.

TABLE 1

| | Content (%) | | Adhesion |
|---|---|---|---|
| | Copper (Cu) | Nickel (Ni) | (gf/inch) |
| Experimental example 1 | 100 | 0 | × |
| Experimental example 2 | 80 | 20 | Δ |
| Experimental example 3 | 70 | 30 | ○ |
| Experimental example 4 | 60 | 40 | ○ |
| Experimental example 5 | 50 | 50 | ○ |
| Experimental example 6 | 40 | 60 | ○ |
| Experimental example 7 | 30 | 70 | ○ |
| Experimental example 8 | 20 | 80 | ○ |

Referring to Table 1 above, it can be seen that the adhesion is increased when the content of nickel added to copper is increased. Considering that the lower limit of the adhesion is 1500 gf/inch, when a copper/nickel alloy is used as the surface treatment layer 170, it may be preferable to maintain the nickel content of 30% or more.

Table 2 below shows the measured values of the sheet resistance of the surface treatment layer 170 according to the mixing ratio of copper and nickel when the copper/nickel alloy is used as the surface treatment layer 170. Here, the sheet resistance value was measured by measuring the change in sheet resistance according to the increase in the nickel content using the sheet resistance value of 100% copper as a reference value, and the increased amount was expressed in %.

TABLE 2

| | Content (%) | | Change in sheet resistance |
|---|---|---|---|
| | Copper (Cu) | Nickel (Ni) | (%) |
| Experimental example 1 | 100 | 0 | Reference value |
| Experimental example 2 | 80 | 20 | +5.2 |
| Experimental example 3 | 70 | 30 | +5.9 |

TABLE 2-continued

| | Content (%) | | Change in sheet resistance |
|---|---|---|---|
| | Copper (Cu) | Nickel (Ni) | (%) |
| Experimental example 4 | 60 | 40 | +6.1 |
| Experimental example 5 | 50 | 50 | +6.7 |
| Experimental example 6 | 40 | 60 | +6.9 |
| Experimental example 7 | 30 | 70 | +10.2 |
| Experimental example 8 | 20 | 80 | +15.1 |

Referring to Table 2 above, it can be seen that as the content of nickel added to copper increases, the sheet resistance also increases. Considering that the allowable increase in sheet resistance is less than 10% based on copper, it may be preferable to maintain the nickel content at 60% or less when a copper/nickel alloy is used as the surface treatment layer 170.

Table 3 below shows environmental reliability (corrosion) measurements of the surface treatment layer 170 according to the mixing ratio of copper and nickel when the copper/nickel alloy is used as the surface treatment layer 170. Here, the environmental reliability is measured by measuring whether the surface treatment layer 170 is corroded while the surface treatment layer 170 is exposed for 120 hours in an environment of 85° C. temperature and 85% humidity. If the corrosion occurred, it was marked with ×, and if the corrosion did not occur, it was marked with ○.

TABLE 3

| | Content (%) | | Corrosion |
|---|---|---|---|
| | Copper (Cu) | Nickel (Ni) | |
| Experimental example 1 | 100 | 0 | × |
| Experimental example 2 | 80 | 20 | ○ |
| Experimental example 3 | 70 | 30 | ○ |
| Experimental example 4 | 60 | 40 | ○ |
| Experimental example 5 | 50 | 50 | ○ |
| Experimental example 6 | 40 | 60 | ○ |
| Experimental example 7 | 30 | 70 | ○ |
| Experimental example 8 | 20 | 80 | ○ |

Referring to Table 3 above, it can be seen that the corrosion is prevented when the content of nickel added to copper is increased. According to Table 3 above, it is preferable to maintain the nickel content of 20% or more.

Combining the results in Tables 1 to 3 above, when using a copper/nickel alloy as the surface treatment layer 170, in order to satisfy all criteria of adhesion, sheet resistance, and environmental reliability (corrosion), it is preferable to constitute the copper/nickel alloy with a mixing ratio of 70 to 40% of copper and 30 to 60% of nickel.

The passivation layer 180 may be formed on the second electrode layer 150, the insulation layer 140, and the via 160 while partially opening the second electrode layer 150.

The passivation layer 180 insulates and protects the second electrode layer 150 and the like, and may be configured to open the surface treatment layer 170 connected to the circuit board. The passivation layer 180 may be formed of a general insulator, for example, at least one material selected from a curable prepolymer, a curable polymer, and a plastic polymer.

The passivation layer 180 may be formed of a varnish-type material that can be made into a film. The varnish-type material may include polysilicon-based materials such as polydimethylsiloxane (PDMS), polyorganosiloxane (POS), polyimide-based materials, or polyurethane-based materials such as spandex, etc. These varnish-type materials are flexible insulators, which can increase the stretchability of the touch sensor and increase the dynamic folding ability.

Although particular embodiments of the present invention have been shown and described, it will be understood by those skilled in the art that it is not intended to limit the present invention to the preferred embodiments, and it will be obvious to those skilled in the art that various changes and modifications may be made without departing from the spirit and scope of the invention.

The scope of the present invention, therefore, is to be defined by the appended claims and equivalents thereof.

| [Description of reference numerals] | |
| --- | --- |
| 110: base layer | 120: seed layer |
| 130: first electrode layer | 140: insulation layer |
| 150: second electrode layer | 160: via |
| 170: surface treatment layer | 180: passivation layer |

The invention claimed is:

1. A circuit board, comprising:
a base layer;
an electrode layer formed on the base layer;
a passivation layer formed on the electrode layer while opening a part of surface of the electrode layer; and
a surface treatment layer formed on the open surface of the electrode layer,
wherein
the electrode layer includes a first electrode layer and a second electrode layer;
the circuit board further comprises an insulation layer formed between the first electrode layer and the second electrode layer and a via penetrating the insulation layer to connect the first electrode layer and the second electrode layer;
the passivation layer is formed on the second electrode layer, the insulation layer, and the via while opening a part of the second electrode layer; and
the surface treatment layer is formed on the open surface of the second electrode layer.

2. The circuit board of claim 1, wherein the base layer is made of glass.

3. The circuit board of claim 2, further comprising:
a seed layer between the base layer and the electrode layer.

4. The circuit board of claim 1, wherein the surface treatment layer is made of an alloy of copper and nickel.

5. The circuit board of claim 4, wherein the surface treatment layer contains 70 to 40% of copper and 30 to 60% of nickel.

6. The circuit board of claim 1, wherein the open surface of the second electrode layer on which the surface treatment layer is formed acts as an LED landing pad on which an LED is mounted.

7. The circuit board of claim 2, wherein the surface treatment layer is made of an alloy of copper and nickel.

8. The circuit board of claim 3, wherein the surface treatment layer is made of an alloy of copper and nickel.

* * * * *